United States Patent
Momiyama et al.

(10) Patent No.: US 11,328,906 B2
(45) Date of Patent: May 10, 2022

(54) ELECTROSTATIC CHUCK

(71) Applicant: TOTO LTD., Kitakyushu (JP)

(72) Inventors: Yutaka Momiyama, Kitakyushu (JP); Hitoshi Sasaki, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 536 days.

(21) Appl. No.: 16/523,686

(22) Filed: Jul. 26, 2019

(65) Prior Publication Data

US 2020/0035468 A1 Jan. 30, 2020

(30) Foreign Application Priority Data

Jul. 30, 2018 (JP) .............................. JP2018-142897
Apr. 26, 2019 (JP) .............................. JP2019-086030

(51) Int. Cl.
*H01L 21/683* (2006.01)
*H01J 37/32* (2006.01)

(52) U.S. Cl.
CPC .... *H01J 37/32715* (2013.01); *H01L 21/6833* (2013.01); *H01J 37/32082* (2013.01); *H01J 2237/2007* (2013.01)

(58) Field of Classification Search
CPC ................. H01J 37/32715; H01L 21/6833
See application file for complete search history.

(56) References Cited

U.S. PATENT DOCUMENTS

| 2003/0007308 A1* | 1/2003 | Harada ................. B23Q 3/154 361/234 |
| 2004/0188321 A1 | 9/2004 | Natsuhara et al. |
| 2011/0096461 A1 | 4/2011 | Yoshikawa et al. |
| 2016/0076129 A1* | 3/2016 | Nagayama .............. C23C 4/131 427/454 |
| 2020/0209184 A1* | 7/2020 | Ikeda ................. G01N 27/4071 |

FOREIGN PATENT DOCUMENTS

WO          03/003449 A2      1/2003

* cited by examiner

*Primary Examiner* — Scott Bauer
(74) *Attorney, Agent, or Firm* — Carrier Blackman & Associates, P.C.; Joseph P. Carrier; William D. Blackman

(57) ABSTRACT

According to one embodiment, an electrostatic chuck includes a ceramic dielectric substrate, a base plate, and a first electrode layer. The ceramic dielectric substrate has a first major surface and a second major surface. The first electrode layer is provided inside the ceramic dielectric substrate and connected to a high frequency power supply. The first electrode layer is provided between the first major surface and the second major surface. The first electrode layer has a first surface and a second surface. The first electrode layer includes a first region including the first surface, a second region including the second surface, and a third region positioned between the first region and the second region. A porosity of the first region is lower than a porosity of the third region.

19 Claims, 10 Drawing Sheets

ELECTROSTATIC CHUCK

CROSS-REFERENCE TO RELATED APPLICATIONS

This application is based upon and claims the benefit of priority from Japanese Patent Application No. 2018-142897, filed on Jul. 30, 2018, and No. 2019-086030, filed on Apr. 26, 2019; the entire contents of which are incorporated herein by reference.

FIELD

Embodiments described herein relate generally to an electrostatic chuck.

BACKGROUND

An electrostatic chuck is used to attract and hold a processing object such as a semiconductor wafer, a glass substrate, etc., inside a plasma processing chamber that performs etching, CVD (Chemical Vapor Deposition), sputtering, ion implantation, ashing, etc. The electrostatic chuck applies electrical power for electrostatic attraction to a built-in electrode and attracts and holds a substrate such as a silicon wafer, etc., by an electrostatic force.

When performing plasma processing, for example, plasma is generated by applying a voltage from an RF (Radio Frequency) power supply (a high frequency power supply) to an upper electrode provided at an upper portion inside a chamber and to a lower electrode provided lower than the upper electrode.

In a conventional electrostatic chuck, the plasma is generated using, as the lower electrode, a base plate provided in a lower portion of the electrostatic chuck. However, the plasma controllability is limited in such a configuration because it is desirable to perform better control of the wafer in-plane distribution of the plasma density by selecting the appropriate frequency.

Therefore, in recent years, it is being attempted to increase the plasma controllability by providing a lower electrode for plasma generation built into a dielectric layer provided on a base plate. In recent years, the plasma density is increasing with the higher integration of devices; and even higher frequencies of the current applied to the plasma generation electrode are desirable.

To accommodate even higher frequencies, it is desirable for the thickness of the lower electrode for plasma generation built into the dielectric layer to be sufficiently thick. Generally, such a thickness is thicker than the thickness of a conventional chucking electrode that is built into the dielectric layer and used to attract and hold a wafer or the like. It is known that problems of internal stress of the electrode due to the electrode being thick, etc., can be relaxed by increasing the porosity.

However, increasing the porosity of the electrode increases the electrical resistance. When the applied current has a high frequency, a new problem occurs in that the electrical resistance undesirably increases if the porosity is high. Generally, when an alternating current flows through an electrode, a phenomenon called skin effect occurs in which the current density is high at the electrode surface and decreases away from the surface. It is known that the concentration of the current at the surface increases as the frequency of the alternating current increases. The inventors newly discovered that when a dielectric layer built-in electrode is used as the lower electrode for plasma generation, it is insufficient merely to increase the porosity when conditions require a higher plasma density.

SUMMARY

According to the embodiment, an electrostatic chuck includes a ceramic dielectric substrate, a base plate, and at least one first electrode layer. The ceramic dielectric substrate has a first major surface and a second major surface. An object to be chucked is placed on the first major surface. The second major surface is on a side opposite to the first major surface. The base plate supports the ceramic dielectric substrate. The first electrode layer is provided inside the ceramic dielectric substrate and connected to a high frequency power supply. The first electrode layer is provided between the first major surface and the second major surface in a Z-axis direction. The Z-axis direction is from the base plate toward the ceramic dielectric substrate. The first electrode layer has a first surface and a second surface. The first surface is on the first major surface side. The second surface is on a side opposite to the first surface. The first electrode layer includes a first region, a second region, and a third region. The first region includes the first surface. The second region includes the second surface. The third region is positioned between the first region and the second region in the Z-axis direction. A porosity of the first region is lower than a porosity of the third region.

DETAILED DESCRIPTION

Figure 1:
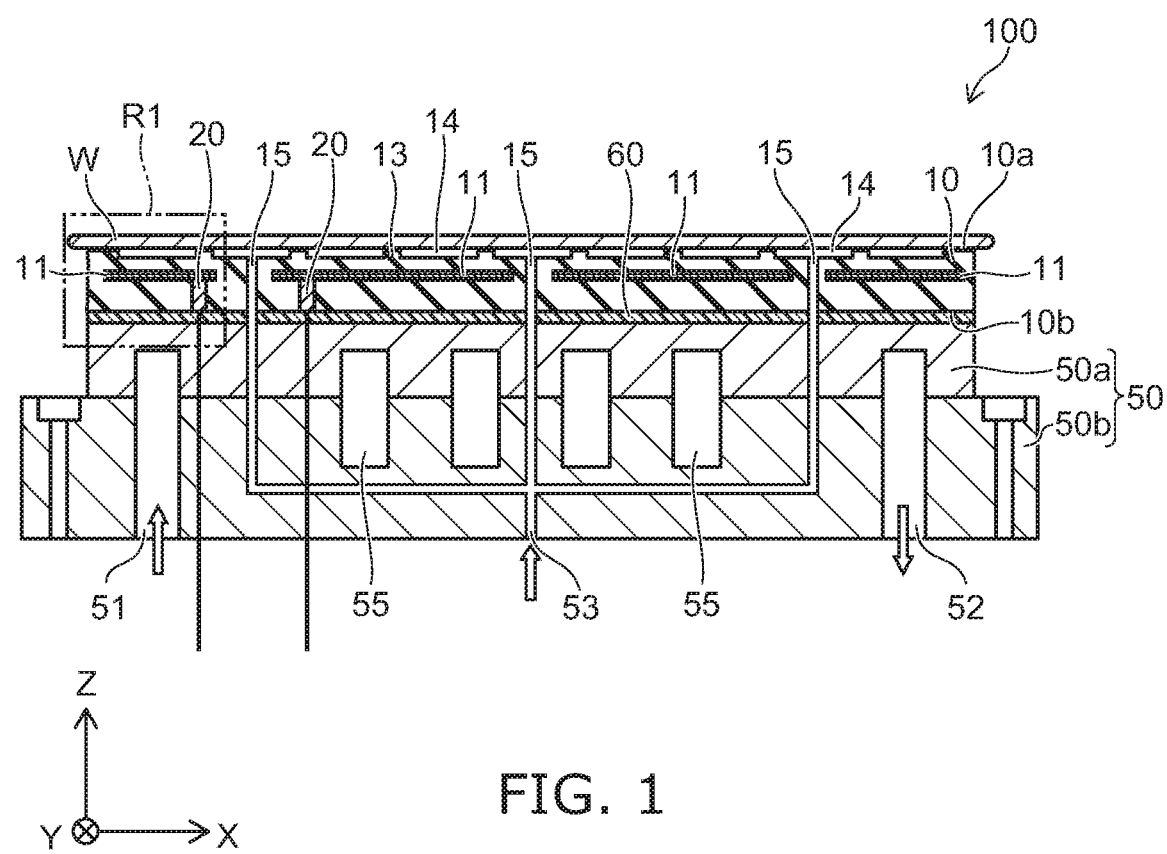
FIG. 1 is a schematic cross-sectional view illustrating an electrostatic chuck according to the embodiment.

A first invention is an electrostatic chuck including a ceramic dielectric substrate, the base plate supporting the ceramic dielectric substrate, and at least one first electrode layer provided inside the ceramic dielectric substrate and connected to a high frequency power supply; the ceramic dielectric substrate has a first major surface on which an object to be chucked is placed, and a second major surface on a side opposite to the first major surface; the first electrode layer is provided between the first major surface and the second major surface in a Z-axis direction which is from the base plate toward the ceramic dielectric substrate; the first electrode layer has a first surface on the first major surface side, and a second surface on a side opposite to the first surface; the first electrode layer includes a first region including the first surface, a second region including the second surface, and a third region positioned between the first region and the second region in the Z-axis direction; and a porosity of the first region is lower than a porosity of the third region.

According to the electrostatic chuck, by providing the first electrode layer that is connected to the high frequency power supply inside the ceramic dielectric substrate, for example, the distance between the first electrode layer (the lower electrode) and the upper electrode for plasma generation provided above the electrostatic chuck can be shortened. Thereby, for example, compared to when the base plate is used as the lower electrode for plasma generation, etc., the plasma density can be increased using low electrical power. According to the electrostatic chuck, by setting the porosity of the first region to be lower than the porosity of the third region, the internal stress in the third region having the high porosity can be relaxed; and the increase of the electrical resistance in the first region where the current flows can be suppressed. Thereby, both the relaxation of the internal stress and the suppression of the electrical resistance increase in the first electrode layer (the lower electrode which is for plasma generation built into the dielectric layer) can be realized.

A second invention is the electrostatic chuck of the first invention, wherein a porosity of the second region is lower than the porosity of the third region.

According to the electrostatic chuck, by setting the porosity of the second region to be lower than the porosity of the third region, the increase of the electrical resistance in the second region can be suppressed. The increase of the electrical resistance in the first electrode layer can be suppressed further thereby.

A third invention is the electrostatic chuck of the first or second invention, wherein the porosity of the third region is not less than 2% and not more than 40%.

According to the electrostatic chuck, by setting the porosity of the third region to be in this range, both the relaxation of the internal stress and the suppression of the electrical resistance increase in the first electrode layer can be realized with better balance.

A fourth invention is the electrostatic chuck of any one of the first to third inventions, wherein at least one of the porosity of the first region or a porosity of the second region is less than 2%.

According to the electrostatic chuck, by setting at least one of the porosity of the first region or the porosity of the second region to be in this range, both the relaxation of the internal stress and the suppression of the electrical resistance increase in the first electrode layer can be realized with better balance.

A fifth invention is the electrostatic chuck of any one of the first to fourth inventions, wherein the first electrode layer is supplied with power from the second surface side; a distance along the Z-axis direction between the first surface and the first major surface is constant; and a distance along the Z-axis direction between the second surface and the first surface at an end portion of the first electrode layer is shorter than a distance along the Z-axis direction between the second surface and the first surface at a central portion of the first electrode layer.

According to the electrostatic chuck, the in-plane uniformity of the plasma density can be increased by setting the distance along the Z-axis direction between the first surface and the first major surface to be constant.

Generally, when an alternating current flows through an electrode, a phenomenon called skin effect occurs in which the current density is high at the electrode surface and decreases away from the surface. It is known that the concentration of the current at the surface increases as the frequency of the alternating current increases. In the invention, because the first electrode layer is connected to the high frequency power supply, it is considered that the skin effect occurs in the first electrode layer; and the alternating current that is applied from the high frequency power supply flows along the surface of the first electrode layer. According to the electrostatic chuck, in the first electrode layer that is connected to the high frequency power supply and supplied with power from the second surface side, the distance along the Z-axis direction between the second surface and the first surface at the end portion of the first electrode layer is set to be shorter than the distance along the Z-axis direction between the second surface and the first surface at the central portion of the first electrode layer. Therefore, the power supply distance from the second surface to the first surface can be shortened. Thereby, the responsiveness (the RF responsiveness) to the control such as modifying the RF output, etc., can be increased.

A new problem was discovered in that when the first electrode layer that is connected to the high frequency power supply is provided inside the ceramic dielectric substrate and the power of the power supply applied to the first electrode layer is increased to increase the plasma density, the environment inside the chamber changes particularly due to the heat generation of the first electrode layer; and an unfavorable effect on the in-plane uniformity of the plasma density arises. According to the electrostatic chuck, the surface area of the second surface of the first electrode layer positioned at the base plate side which has a cooling function can be set to be relatively large by setting the distance along the Z-axis direction between the second surface and the first surface at the end portion of the first electrode layer to be shorter than the distance along the Z-axis direction between the second surface and the first surface at the central portion of the first electrode layer. Thereby, the first electrode layer can dissipate heat more effectively; and the in-plane uniformity of the plasma density can be increased further.

A sixth invention is the electrostatic chuck of any one of the first to fifth inventions, wherein the first electrode layer includes at least one of Ag, Pd, or Pt.

Thus, according to the electrostatic chuck, for example, the first electrode layer that includes a metal such as Ag, Pd, Pt, etc., can be used.

A seventh invention is the electrostatic chuck of any one of the first to sixth inventions, wherein the first electrode layer is made of a cermet of a metal and a ceramic.

According to the electrostatic chuck, by forming the first electrode layer from a cermet, the adhesion between the first electrode layer and the ceramic dielectric substrate can be increased; and the strength of the first electrode layer can be increased.

An eighth invention is the electrostatic chuck of any one of the first to seventh inventions, wherein a distance along the Z-axis direction between the second surface and the first surface at a central portion of the first electrode layer is not less than 1 µm and not more than 500 µm.

According to the electrostatic chuck, by setting the distance along the Z-axis direction between the second surface and the first surface at the central portion of the first electrode layer (the thickness of the first electrode layer at the central portion) to be in this range, the effects of the skin effect can be reduced; and the in-plane uniformity of the plasma density can be increased further; and the decrease of the RF responsiveness can be suppressed.

A ninth invention is the electrostatic chuck of an eighth invention, wherein the distance along the Z-axis direction between the second surface and the first surface at the central portion of the first electrode layer is not less than 10 µm and not more than 100 µm.

According to the electrostatic chuck, by setting the distance along the Z-axis direction between the second surface and the first surface at the central portion of the first electrode layer (the thickness of the first electrode layer at the central portion) to be in this range, the effects of the skin effect can be reduced; the in-plane uniformity of the plasma density can be increased even more; and the decrease of the RF responsiveness can be suppressed.

A tenth invention is the electrostatic chuck of any one of the first to ninth inventions, wherein the ceramic dielectric substrate includes aluminum oxide; and a concentration of the aluminum oxide in the ceramic dielectric substrate is 90 mass % or more.

According to the electrostatic chuck, the plasma resistance of the ceramic dielectric substrate can be improved by using high-purity aluminum oxide.

An eleventh invention is the electrostatic chuck of any one of the first to tenth inventions, further including at least one second electrode layer provided inside the ceramic dielectric substrate and connected to a chucking power supply; and the second electrode layer is provided between the first electrode layer and the first major surface in the Z-axis direction.

Thus, according to the electrostatic chuck, the second electrode layer which is the chucking electrode for attracting and holding the object can be provided separately from the first electrode layer which is the lower electrode for generating the plasma.

A twelfth invention is the electrostatic chuck of the eleventh invention, wherein a total of a surface area of the first surface of the first electrode layer is larger than a total of a surface area of a surface of the second electrode layer on the first major surface side.

According to the electrostatic chuck, the in-plane uniformity of the plasma density can be increased further by setting the total of the surface area of the first surface of the first electrode layer to be larger than the total of the surface area of the surface of the second electrode layer on the first major surface side.

A thirteenth invention is an electrostatic chuck of the eleventh or twelfth invention, wherein a thickness of the first electrode layer is greater than a thickness of the second electrode layer.

According to the electrostatic chuck, by setting the thickness of the first electrode layer to be greater than the thickness of the second electrode layer, the effects of the skin effect can be reduced; and the in-plane uniformity of the plasma density can be increased further.

A fourteenth invention is the electrostatic chuck of any one of the eleventh to thirteenth inventions, wherein a portion of the first electrode layer does not overlap the second electrode layer in the Z-axis direction.

According to the electrostatic chuck, the in-plane uniformity of the plasma density can be increased further by setting a portion of the first electrode layer not to overlap the second electrode layer in the Z-axis direction.

A fifteenth invention is the electrostatic chuck of any one of the eleventh to fourteenth inventions, wherein the first electrode layer includes a metal and a ceramic; the second electrode layer includes a metal and a ceramic; and a proportion of a volume of the metal to a total of the volume of the metal and a volume of the ceramic for the metal and the ceramic included in the first electrode layer is larger than a proportion of a volume of the metal to a total of the volume of the metal and a volume of the ceramic for the metal and the ceramic included in the second electrode layer.

According to the electrostatic chuck, by setting the proportion of the metal included in the first electrode layer to be larger than the proportion of the metal included in the second electrode layer, for example, the electrical resistance of the first electrode layer to which the voltage is applied from the high frequency power supply can be reduced; and the RF responsiveness and the in-plane uniformity of the plasma density can be increased.

A sixteenth invention is the electrostatic chuck of any one of the eleventh to fourteenth inventions, wherein the first electrode layer includes a metal and a ceramic; the second electrode layer includes a metal and a ceramic; and a volume of the metal included in the first electrode layer is larger than a volume of the metal included in the second electrode layer.

According to the electrostatic chuck, by setting the volume of the metal included in the first electrode layer to be larger than the volume of the metal included in the second electrode layer, for example, the electrical resistance of the first electrode layer to which the voltage is applied from the high frequency power supply can be reduced; and the RF responsiveness and the in-plane uniformity of the plasma density can be increased.

A seventeenth invention is the electrostatic chuck of any one of the eleventh to sixteenth inventions, wherein a distance along the Z-axis direction between the first electrode layer and the second electrode layer is greater than a distance along the Z-axis direction between the first major surface and the second electrode layer.

According to the electrostatic chuck, by setting the distance along the Z-axis between the first electrode layer and the second electrode layer to be greater than the distance along the Z-axis between the first major surface and the second electrode layer, the occurrence of discrepancies such as shorts and/or dielectric breakdown between the first electrode layer and the second electrode layer, etc., can be suppressed more effectively even when the voltage is applied from the high frequency power supply.

An eighteenth invention is the electrostatic chuck of any one of the first to tenth inventions, wherein the first electrode layer is connected to a chucking power supply.

Thus, according to the electrostatic chuck, the electrode layer which is the lower electrode for generating the plasma also can be used as the chucking electrode for attracting and holding the object.

A nineteenth invention is the electrostatic chuck of the fifth invention, wherein a width of the end portion is greater than the distance along the Z-axis direction between the second surface and the first surface at the central portion of the first electrode layer.

According to the electrostatic chuck, the power supply distance can be shortened by setting the width of the end portion of the first electrode layer to be greater than the distance along the Z-axis direction between the second surface and the first surface at the central portion of the first electrode layer (i.e., the thickness at the central portion of the first electrode layer). Thereby, the responsiveness (the RF responsiveness) to the control such as modifying the RF output, etc., can be increased further.

Embodiments of the invention will now be described with reference to the drawings. Similar components in the drawings are marked with the same reference numerals; and a detailed description is omitted as appropriate.

FIG. 1 is a schematic cross-sectional view illustrating an electrostatic chuck according to the embodiment.

As illustrated in FIG. 1, the electrostatic chuck 100 includes a ceramic dielectric substrate 10, a first electrode layer 11, and a base plate 50.

The ceramic dielectric substrate 10 is, for example, a base material having a flat plate configuration made of a sintered ceramic. For example, the ceramic dielectric substrate 10 includes aluminum oxide (alumina ($Al_2O_3$)). For example, the ceramic dielectric substrate 10 is formed of high-purity aluminum oxide. The concentration of the aluminum oxide in the ceramic dielectric substrate 10 is, for example, not less than 90 mass percent (mass %) and not more than 100 mass %, and favorably not less than 95 mass percent (mass %) and not more than 100 mass %, and more favorably not less than 99 mass percent (mass %) and not more than 100 mass %. By using high-purity aluminum oxide, the plasma resistance of the ceramic dielectric substrate 10 can be improved. The concentration of the aluminum oxide can be measured by fluorescent X-ray analysis, etc.

The ceramic dielectric substrate 10 has a first major surface 10a and a second major surface 10b. The first major surface 10a is a surface where an object W to be chucked is placed. The second major surface 10b is a surface on the side opposite to the first major surface 10a. The object W to be chucked is, for example, a semiconductor substrate such as a silicon wafer, etc.

In this specification, the direction from the base plate 50 toward the ceramic dielectric substrate 10 is taken as a Z-axis direction. For example, as illustrated in the drawings, the Z-axis direction is the direction connecting the first major surface 10a and the second major surface 10b. The Z-axis direction is, for example, a direction substantially perpendicular to the first major surface 10a and the second major surface 10b. One direction orthogonal to the Z-axis direction is taken as an X-axis direction; and a direction orthogonal to the Z-axis direction and the X-axis direction is taken as a Y-axis direction. In this specification, "in the plane" is, for example, in the X-Y plane.

The first electrode layer 11 is provided inside the ceramic dielectric substrate 10. The first electrode layer 11 is provided between a first major surface 10a and a second major surface 10b. In other words, the first electrode layer 11 is inserted into the ceramic dielectric substrate 10. For example, the first electrode layer 11 may be built into the ceramic dielectric substrate 10 by sintering as one body.

Thus, by providing the first electrode layer 11 inside the ceramic dielectric substrate 10, the distance between the first electrode layer 11 (the lower electrode) and an upper electrode (an upper electrode 510 of FIG. 7) provided above the electrostatic chuck 100 can be shortened. Thereby, for example, compared to when the base plate 50 is used as the lower electrode, etc., the plasma density can be increased using low electrical power. In other words, the electrical power that is necessary to obtain the high plasma density can be reduced.

The first electrode layer 11 has a thin-film configuration along the first major surface 10a and the second major surface 10b of the ceramic dielectric substrate 10. The cross-sectional configuration of the first electrode layer 11 is described below.

Figure 7:
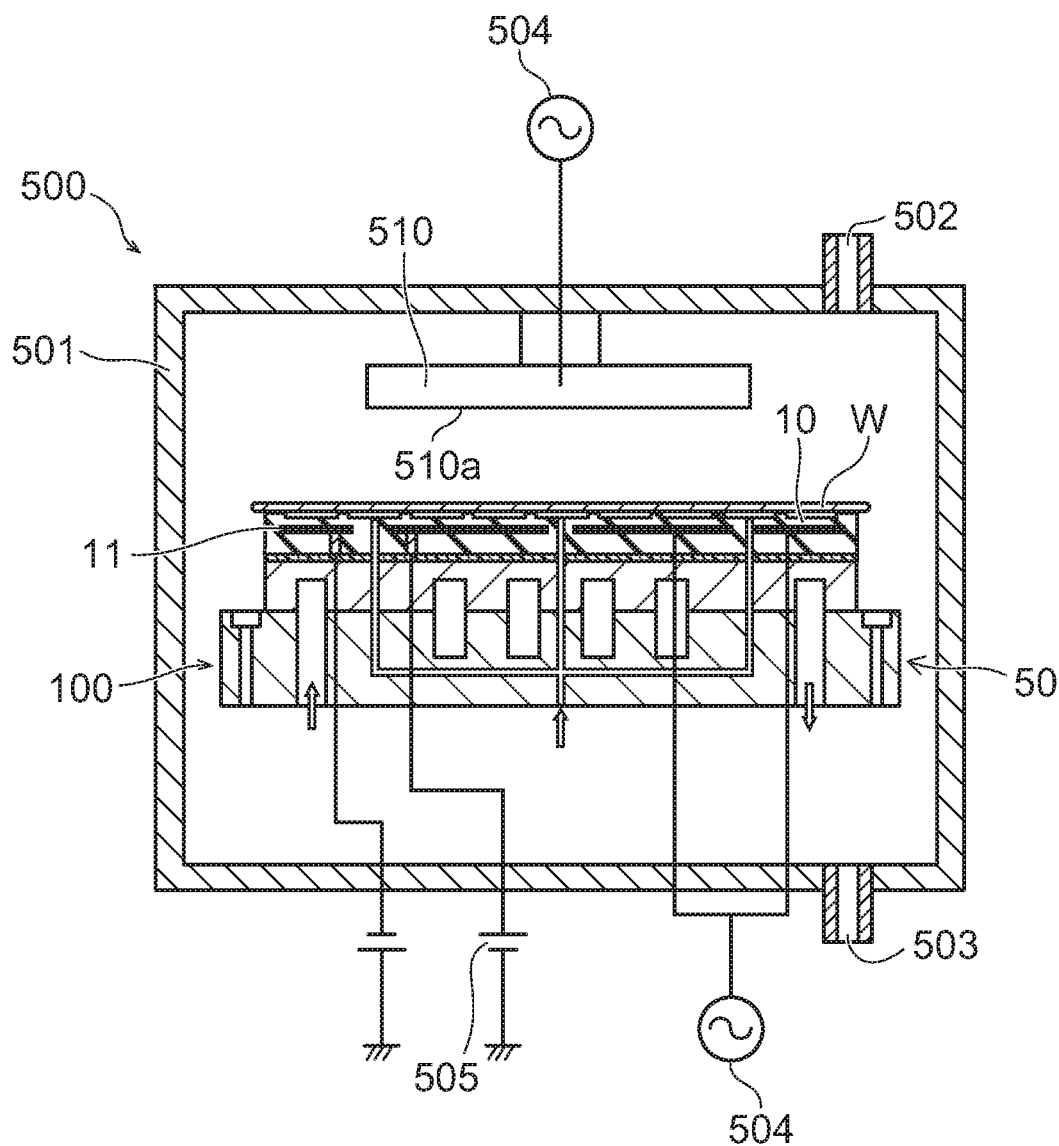
FIG. 7 is a cross-sectional view schematically illustrating a wafer processing apparatus including the electrostatic chuck according to the embodiment.

The first electrode layer 11 is connected to a high frequency power supply (a high frequency power supply 504 of FIG. 7). Plasma is generated inside a processing container 501 by applying the voltage (the high frequency voltage) from the high frequency power supply to the first electrode layer 11 and the upper electrode (the upper electrode 510 of FIG. 7). In other words, the first electrode layer 11 is a lower electrode for generating the plasma. The high frequency power supply supplies a high frequency AC current (alternating current) to the first electrode layer 11. Here, "high frequency" is, for example, 200 kHz or more.

For example, the first electrode layer 11 is made of a metal. The first electrode layer 11 includes, for example, at least one of Ag, Pd, or Pt. The first electrode layer 11 may include, for example, a metal and a ceramic. For example, the first electrode layer 11 may be made of a cermet of a metal and a ceramic. The cermet is a composite material including a metal and a ceramic (an oxide, a carbide, etc.). By forming the first electrode layer 11 from a cermet, the adhesion between the first electrode layer 11 and the ceramic dielectric substrate 10 can be increased. Also, the strength of the first electrode layer 11 can be increased.

The metal that is included in the cermet includes, for example, at least one of Ag, Pd, or Pt. The ceramic that is included in the cermet includes, for example, the same element as the ceramic included in the ceramic dielectric substrate 10. By forming the first electrode layer 11 from a cermet of a ceramic including the same element as the ceramic included in the ceramic dielectric substrate 10, the difference between the thermal expansion coefficient of the first electrode layer 11 and the thermal expansion coefficient of the ceramic dielectric substrate 10 can be reduced. Thereby, the adhesion between the first electrode layer 11 and the ceramic dielectric substrate 10 can be increased; and discrepancies such as peeling, etc., can be suppressed. The ceramic that is included in the cermet may include an element different from that of the ceramic included in the ceramic dielectric substrate 10.

In the example, the first electrode layer 11 is connected to a chucking power supply (a chucking power supply 505 of FIG. 7). The electrostatic chuck 100 attracts and holds an object W by an electrostatic force by generating a charge at the first major surface 10a side of the first electrode layer 11 by applying a voltage (a chucking voltage) to the first electrode layer 11 from the chucking power supply. In other words, the first electrode layer 11 is a chucking electrode for attracting and holding the object W. Thus, according to the embodiment, the first electrode layer 11 which is the lower electrode for generating the plasma also can be used as the chucking electrode for attracting and holding the object. The chucking power supply supplies a direct current (DC) or an AC current to the first electrode layer 11. The chucking power supply is, for example, a DC power supply. The chucking power supply may be, for example, an AC power supply.

A connection portion 20 that extends to the second major surface 10b side of the ceramic dielectric substrate 10 is provided at the first electrode layer 11. The connection portion 20 is, for example, a via (solid) or a via hole (hollow)

that is electrically connected to the first electrode layer 11. The connection portion 20 may be a metal terminal connected by an appropriate method such as brazing, etc.

The base plate 50 is a member supporting the ceramic dielectric substrate 10. The ceramic dielectric substrate 10 is fixed on the base plate 50 by a bonding member 60. For example, a silicone bonding agent is used as the bonding member 60.

For example, the base plate 50 is made of a metal such as aluminum, etc. For example, the base plate 50 may be made of a ceramic. For example, the base plate 50 is divided into an upper portion 50a and a lower portion 50b; and a passageway 55 is provided between the upper portion 50a and the lower portion 50b. One end of the passageway 55 is connected to an input channel 51; and the other end of the passageway 55 is connected to an output channel 52.

The base plate 50 also performs the role of the temperature adjustment of the electrostatic chuck 100. For example, when cooling the electrostatic chuck 100, a cooling medium such as helium gas or the like is caused to inflow through the input channel 51, pass through the passageway 55, and outflow from the output channel 52. Thereby, the heat of the base plate 50 can be absorbed by the cooling medium; and the ceramic dielectric substrate 10 that is mounted on the base plate 50 can be cooled. On the other hand, when maintaining the temperature of the electrostatic chuck 100, it is also possible to introduce a heat-retaining medium into the passageway 55. It is also possible to provide a built-in heating element in the ceramic dielectric substrate 10 and/or the base plate 50. The temperature of the object W held by the electrostatic chuck 100 can be adjusted by adjusting the temperature of the base plate 50 and/or the ceramic dielectric substrate 10.

In the example, a channel 14 is provided at the first major surface 10a side of the ceramic dielectric substrate 10. The channel 14 is recessed in the direction from the first major surface 10a toward the second major surface 10b (the Z-axis direction) and extends to be continuous in the X-Y plane. The portion where the channel 14 is not provided is taken as a protrusion 13; and the object W is placed on the protrusion 13. The first major surface 10a is a surface contacting the back surface of the object W. In other words, the first major surface 10a is a plane including the upper surface of the protrusion 13. A space is formed between the channel 14 and the back surface of the object W placed on the electrostatic chuck 100.

The ceramic dielectric substrate 10 has a through-hole 15 connected to the channel 14. The through-hole 15 is provided from the second major surface 10b to the first major surface 10a. In other words, the through-hole 15 extends in the Z-axis direction from the second major surface 10b to the first major surface 10a and pierces the ceramic dielectric substrate 10.

The temperature of the object W and/or the particles adhered to the object W can be controlled to a favorable state by appropriately selecting the height of the protrusion 13 (the depth of the channel 14), the surface area ratio of the protrusion 13 and the channel 14, the shapes, etc.

A gas introduction channel 53 is provided in the base plate 50. For example, the gas introduction channel 53 is provided to pierce the base plate 50. The gas introduction channel 53 may not pierce through the base plate 50, and may be provided to reach the ceramic dielectric substrate 10 side by branching partway into other gas introduction channels 53. The gas introduction channel 53 may be provided in multiple locations of the base plate 50.

The gas introduction channel 53 communicates with the through-hole 15. In other words, the transfer gas (helium (He) or the like) that inflows into the gas introduction channel 53 inflows into the through-hole 15 after passing through the gas introduction channel 53.

The transfer gas that inflows into the through-hole 15 inflows into the space provided between the object W and the channel 14 after passing through the through-hole 15. Thereby, the object W can be directly cooled by the transfer gas.

Figure 2:
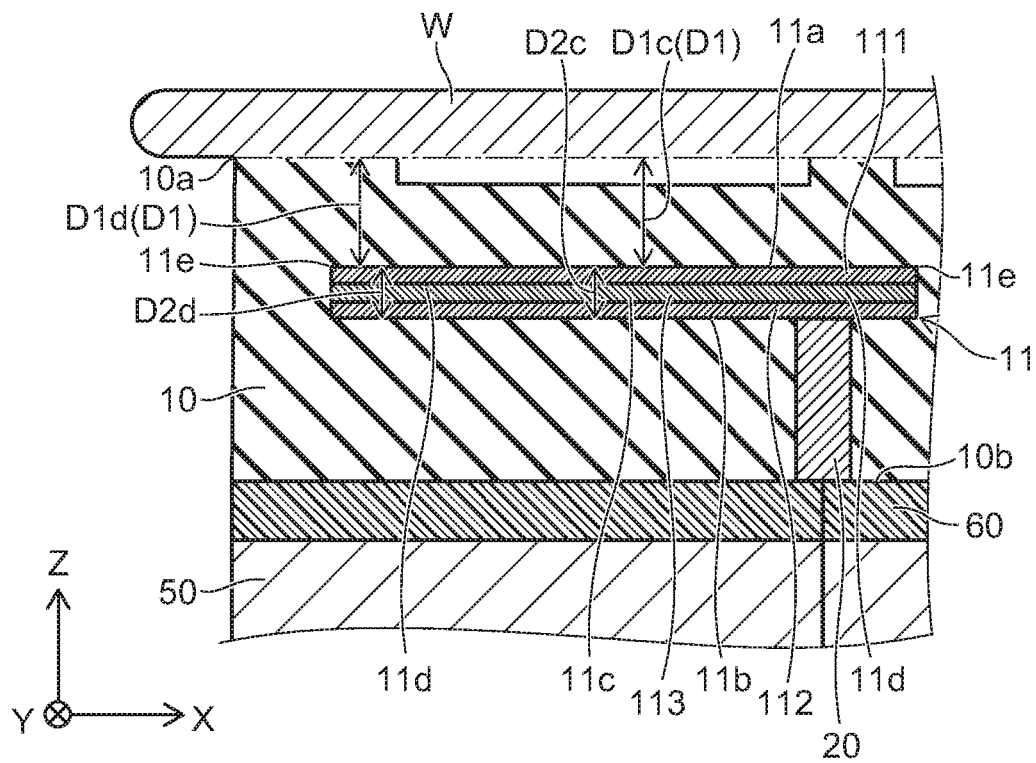
FIG. 2 is a cross-sectional view schematically illustrating an enlarged portion of the electrostatic chuck according to the embodiment.

FIG. 2 is a cross-sectional view schematically illustrating an enlarged portion of the electrostatic chuck according to the embodiment.

Figure 3A:
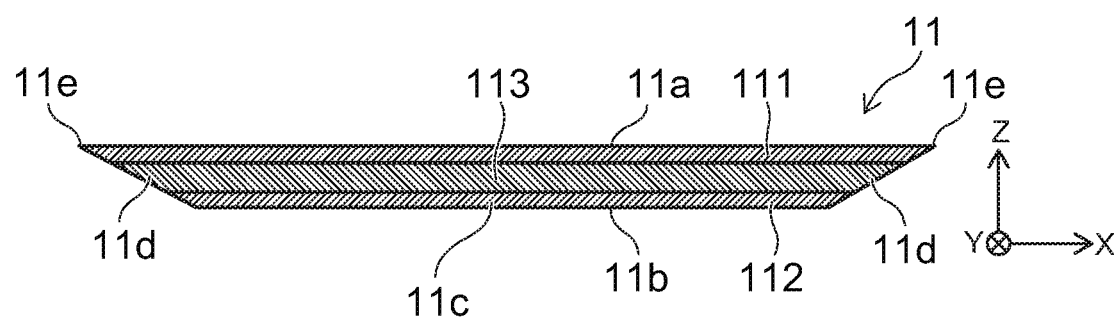
FIG. 3A to FIG. 3C are cross-sectional views schematically illustrating modifications of the first electrode layer of the electrostatic chuck according to the embodiment.
Figure 3B:
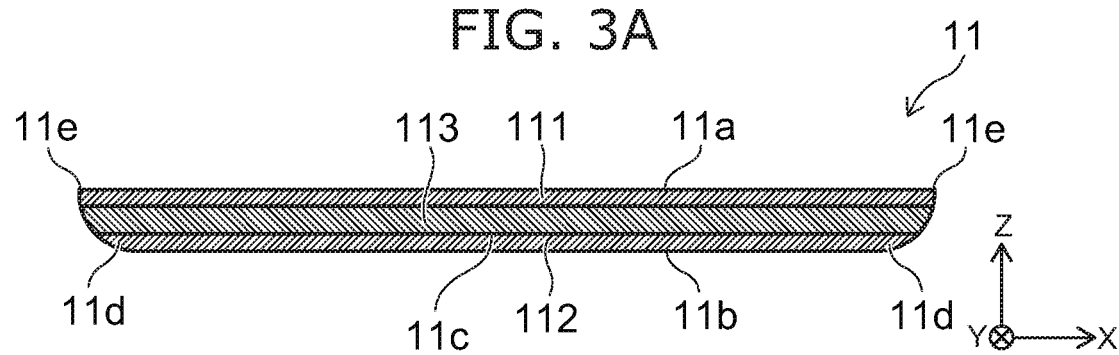
Figure 3C:
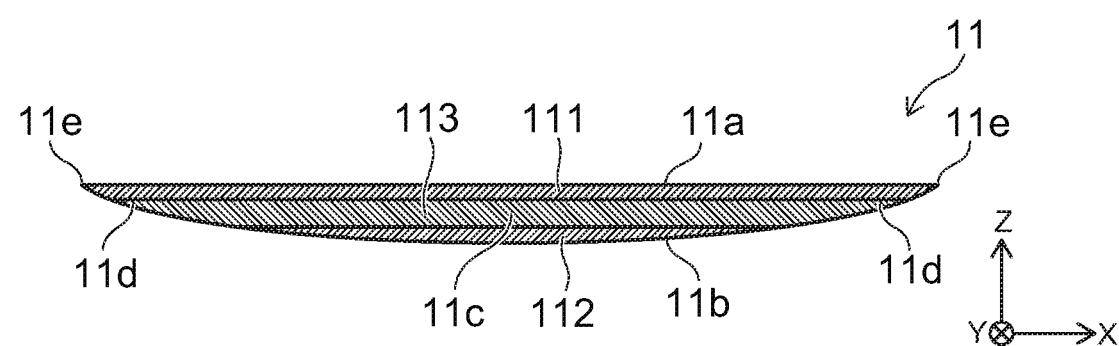

FIG. 3A to FIG. 3C are cross-sectional views schematically illustrating modifications of the first electrode layer of the electrostatic chuck according to the embodiment.

FIG. 2 shows an enlargement of a region R1 shown in FIG. 1.

As illustrated in FIG. 2, the first electrode layer 11 has a first surface 11a and a second surface 11b. The first surface 11a is a surface on the first major surface 10a side. The second surface 11b is a surface on the side opposite to the first surface 11a. In other words, the first surface 11a is the surface opposing the first major surface 10a. In other words, the second surface 11b is the surface opposing the second major surface 10b.

As illustrated in FIG. 2, the first electrode layer 11 includes a first region 111, a second region 112, and a third region 113. The first region 111 is a region including the first surface 11a. The second region 112 is a region including the second surface. The third region 113 is a region positioned between the first region 111 and the second region 112 in the Z-axis direction. The third region 113 is, for example, a region including the center of the first electrode layer 11 in the Z-axis direction.

The length (the thickness) along the Z-axis direction of the first region 111 is, for example, greater than 5% and less than 50% of the thickness of the first electrode layer 11, and favorably is greater than 10% and less than 40%. The length (the thickness) along the Z-axis direction of the second region 112 is, for example, greater than 5% and less than 50% of the thickness of the first electrode layer 11, and favorably is greater than 10% and less than 40%. The length (the thickness) along the Z-axis direction of the third region 113 is, for example, greater than 0% and less than 90% of the thickness of the first electrode layer 11, and favorably is greater than 20% and less than 80%. In the case where the third region 113 includes the center of the first electrode layer 11 in the Z-axis direction, for example, the third region 113 is a region greater than 0% and less than 45% of the thickness of the first electrode layer 11 above and below from the center of the first electrode layer 11 in the Z-axis direction, and favorably may be greater than 10% and less than 40%.

In the embodiment, the porosity of the first region 111 is lower than the porosity of the third region 113. By setting the porosity of the first region 111 to be lower than the porosity of the third region 113, the internal stress in the third region 113 having the high porosity can be relaxed; and the increase of the electrical resistance in the first region 111 in which the current flows can be suppressed. Both the relaxation of the internal stress and the suppression of the electrical resistance increase in the first electrode layer 11 (the lower electrode built into the dielectric layer) can be realized thereby.

The porosity of the second region 112 is, for example, lower than the porosity of the third region 113. By setting the porosity of the second region 112 to be lower than the porosity of the third region 113, the increase of the electrical resistance in the second region 112 can be suppressed. The increase of the electrical resistance in the first electrode layer 11 can be suppressed further thereby.

For example, at least one of the porosity of the first region 111 or the porosity of the second region 112 is less than 2%. By setting at least one of the porosity of the first region 111 or the porosity of the second region 112 to be in this range, both the relaxation of the internal stress and the suppression of the electrical resistance increase in the first electrode layer 11 can be realized with better balance.

For example, the porosity of the third region 113 is not less than 2% and not more than 40%. By setting the porosity of the third region 113 to be in this range, both the relaxation of the internal stress and the suppression of the electrical resistance increase in the first electrode layer 11 can be realized with better balance.

For example, the porosity can be determined by embedding in a resin the cross section of the sample to be measured, polishing until the sample cross section surface has a mirror surface, imaging using a SEM (Scanning Electron Microscope), and performing image analysis of the image. More specifically, for example, the first electrode layer 11 is cut, embedded in a resin, and mechanically polished until the cross-sectional direction can be observed by SEM. The cross section is polished until the cross section has a mirror surface; Pt is vapor-deposited on the sample; and SEM observation is performed. The observation magnification is 500 times; and five fields are observed to ascertain the structure fluctuation of the sample. The SEM observation image is analyzed using the commercial two-dimensional image analysis software "Win Roof;" and the pores are quantified. The values of the five fields are averaged and used as the porosity.

In the embodiment, for example, a distance D1 along the Z-axis direction between the first surface 11a and the first major surface 10a is constant. In other words, the distance D1 is the distance from the first major surface 10a to the upper surface (the first surface 11a) of the first electrode layer 11. Here, "constant" may include, for example, the waviness of the first surface 11a, etc. For example, it is sufficient for the distance D1 to be substantially constant when the cross section of the electrostatic chuck 100 is observed by a scanning electron microscope (SEM), etc., at a low magnification (e.g., about 100 times). For example, the difference between a distance D1c at a central portion 11c of the first electrode layer 11 and a distance D1d at an end portion 11d of the first electrode layer 11 is 0±150 μm. The distance D1 (the distance D1c and the distance D1d) are, for example, about 300 μm. The first surface 11a is, for example, a surface parallel to the first major surface 10a.

As illustrated in FIG. 2, an end portion 11d of the first electrode layer 11 is the region including an edge 11e of the first electrode layer 11 in the X-Y plane. The edge 11e of the first electrode layer 11 is positioned at the first surface 11a and refers to the interface between the first electrode layer 11 and the ceramic dielectric substrate 10 when viewed from the Z-axis direction. The central portion 11c of the first electrode layer 11 is the region in the X-Y plane positioned between two end portions 11d. The central portion 11c and the end portion 11d of the first electrode layer 11 are described below.

Thus, by setting the distance D1 along the Z-axis direction between the first surface 11a and the first major surface 10a to be constant, the distance between the first electrode layer 11 (the lower electrode) and the upper electrode (the upper electrode 510 of FIG. 7) can be constant. Thereby, for example, the in-plane uniformity of the plasma density can be increased compared to the case where the distance D1 along the Z-axis direction between the first surface 11a and the first major surface 10a is not constant, etc. For example, the in-plane uniformity of the plasma density can be increased compared to the case where the distance along the Z-axis direction between the first surface 11a and the first major surface 10a at the end portion 11d is different from the distance along the Z-axis direction between the first surface 11a and the first major surface 10a at the central portion 11c when the cross-sectional configuration of the first electrode layer 11 is upwardly convex, etc.

A distance D2d along the Z-axis direction between the second surface 11b and the first surface 11a at the end portion 11d of the first electrode layer 11 is, for example, substantially the same as a distance D2c along the Z-axis direction between the second surface 11b and the first surface 11a at the central portion 11c of the first electrode layer 11. In other words, the distance D2c is the thickness of the first electrode layer 11 at the central portion 11c. In other words, the distance D2d is the thickness of the first electrode layer 11 at the end portion 11d. That is, the thickness of the first electrode layer 11 at the end portion 11d is substantially the same as the thickness of the first electrode layer 11 at the central portion 11c. For example, the thickness of the first electrode layer 11 is constant.

The cross-sectional configuration of the first electrode layer 11 is not limited thereto. As illustrated in FIG. 3A to FIG. 3C, it is favorable for the cross-sectional configuration of the first electrode layer 11 to be downwardly convex. More specifically, the distance D2d along the Z-axis direction between the second surface 11b and the first surface 11a at the end portion 11d of the first electrode layer 11 is less than the distance D2c along the Z-axis direction between the second surface 11b and the first surface 11a at the central portion 11c of the first electrode layer 11. That is, in these examples, the thickness of the first electrode layer 11 at the end portion 11d is thinner than the thickness of the first electrode layer 11 at the central portion 11c. For example, the thickness of the first electrode layer 11 decreases from the central portion 11c toward the end portion 11d. The first electrode layer 11 has a configuration that is convex toward the second surface 11b side.

The distance D2c is, for example, not less than 1 μm and not more than 500 μm, and favorably not less than 10 μm and not more than 100 μm, and more favorably not less than 20 μm and not more than 70 μm. By setting the thickness (the distance D2c) of the first electrode layer 11 at the central portion 11c to be in this range, the effects of the skin effect can be reduced; and the in-plane uniformity of the plasma density can be increased further. For example, the distance D2c can be determined as the average value of the thicknesses at three points of the central portion 11c in a cross section SEM (Scanning Electron Microscope) image of the first electrode layer 11. In this specification, the distance D2c is defined as the average value.

A high frequency current is supplied to the first electrode layer 11 from the second surface 11b side. Normally, when an AC current flows through an electrode layer, a skin effect occurs in which the current density is high at the surface of the electrode layer and decreases away from the surface. Also, the surface concentration of the current becomes more pronounced for higher frequencies of the AC current that flows. That is, the high frequency AC current that flows into the first electrode layer 11 from the second surface 11b side flows along the second surface 11b of the first electrode layer 11 into the first surface 11a.

In the embodiment, the power supply distance to the first surface 11a from the second surface 11b which is supplied with power can be shortened by setting the distance D2d along the Z-axis direction between the second surface 11b and the first surface 11a at the end portion 11d of the first electrode layer 11 to be less than the distance D2c along the Z-axis direction between the second surface 11b and the first surface 11a at the central portion 11c of the first electrode layer 11. Thereby, the responsiveness (the RF responsiveness) to the control such as modifying the RF output, etc., can be increased further.

According to the embodiment, the distance D2d along the Z-axis direction between the second surface 11b and the first surface 11a at the end portion 11d of the first electrode layer 11 is set to be less than the distance D2c along the Z-axis direction between the second surface 11b and the first surface 11a at the central portion 11c of the first electrode layer 11. For example, by setting the first electrode layer 11 to have a configuration that is convex toward the second surface 11b side (i.e., the base plate 50 side), the surface area of the second surface 11b which is the surface of the first electrode layer 11 at the base plate 50 side which has a cooling function can be set to be relatively large. Thereby, the first electrode layer 11 can dissipate heat more effectively; and the in-plane uniformity of the plasma density can be increased further.

In the example of FIG. 3A, the thickness of the first electrode layer 11 at the central portion 11c is substantially constant. In other words, the second surface 11b at the central portion 11c is substantially parallel to the first surface 11a. On the other hand, the thickness of the first electrode layer 11 at the end portion 11d decreases toward the edge 11e from the central portion 11c side. In other words, the second surface 11b at the end portion 11d has an oblique surface tilted upward from the central portion 11c side toward the edge 11e. In the example, the oblique surface has a planar configuration. The oblique surface may have a curved configuration as illustrated in FIG. 3B.

For example, as illustrated in FIG. 3C, the second surface 11b may have an oblique surface tilted upward toward the edge 11e from the center of the second surface 11b in the X-Y plane. In other words, the thickness of the first electrode layer 11 at the central portion 11c may not be constant. In other words, the second surface 11b at the central portion 11c may not be parallel to the first surface 11a. In such a case, the oblique surface may have a curved configuration as illustrated in FIG. 3C.

FIG. 4A, FIG. 4B, FIG. 5A, FIG. 5B, FIG. 6A, and FIG. 6B are plan views schematically illustrating a portion of the electrostatic chuck according to the embodiment.

These drawings are plan views viewing the first electrode layer 11 from the second surface 11b side (the lower side) in a state in which the portion of the ceramic dielectric substrate 10 positioned at the base plate 50 side (the lower side) of the first electrode layer 11 (the second surface 11b), the base plate 50, etc., of the electrostatic chuck 100 are not illustrated.

Figure 4A:
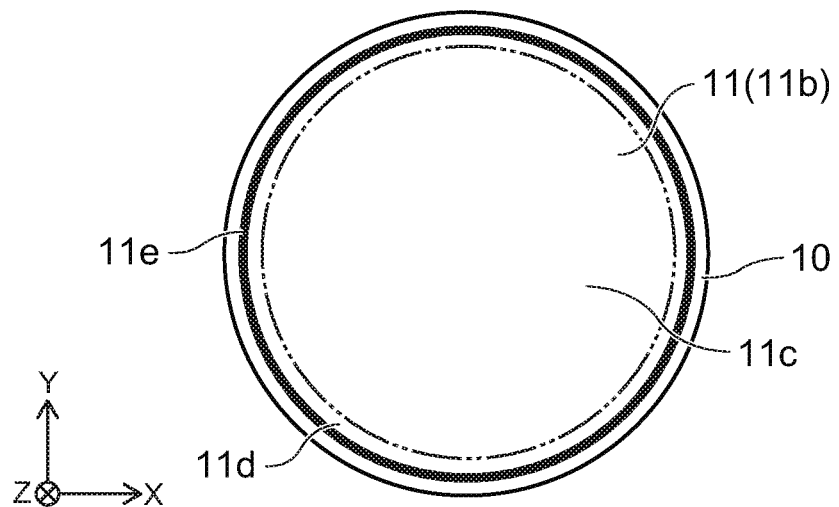
FIG. 4A and FIG. 4B are plan views schematically illustrating a portion of the electrostatic chuck according to the embodiment.
Figure 4B:
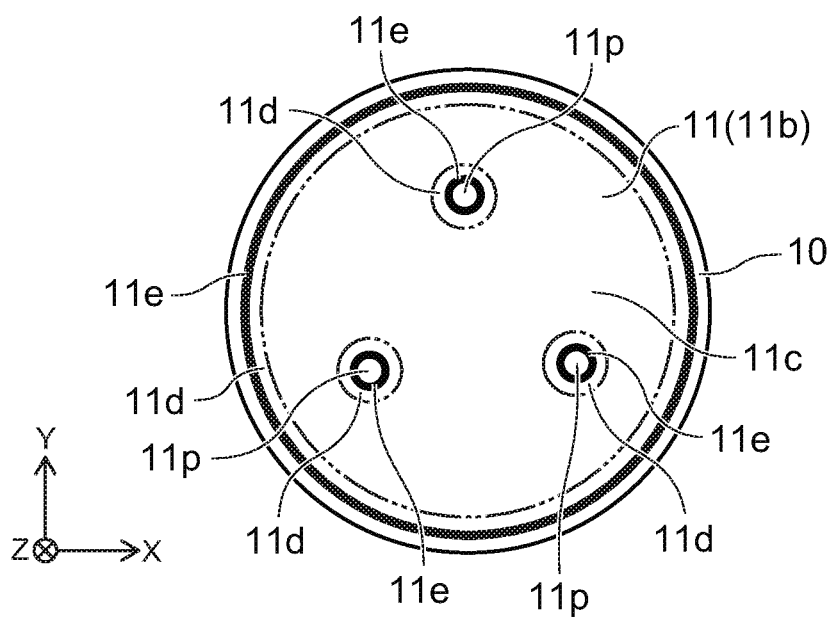
Figure 5A:
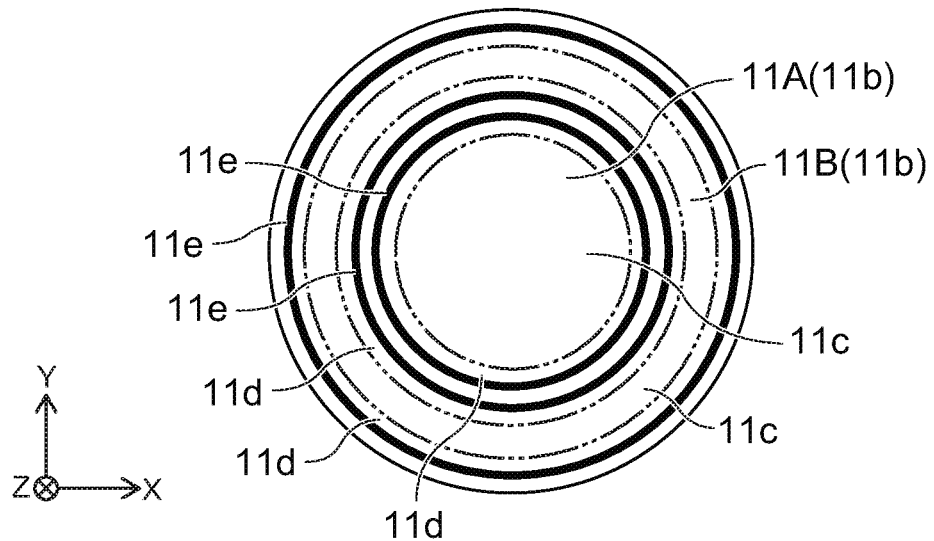
FIG. 5A and FIG. 5B are plan views schematically illustrating a portion of the electrostatic chuck according to the embodiment.
Figure 5B:
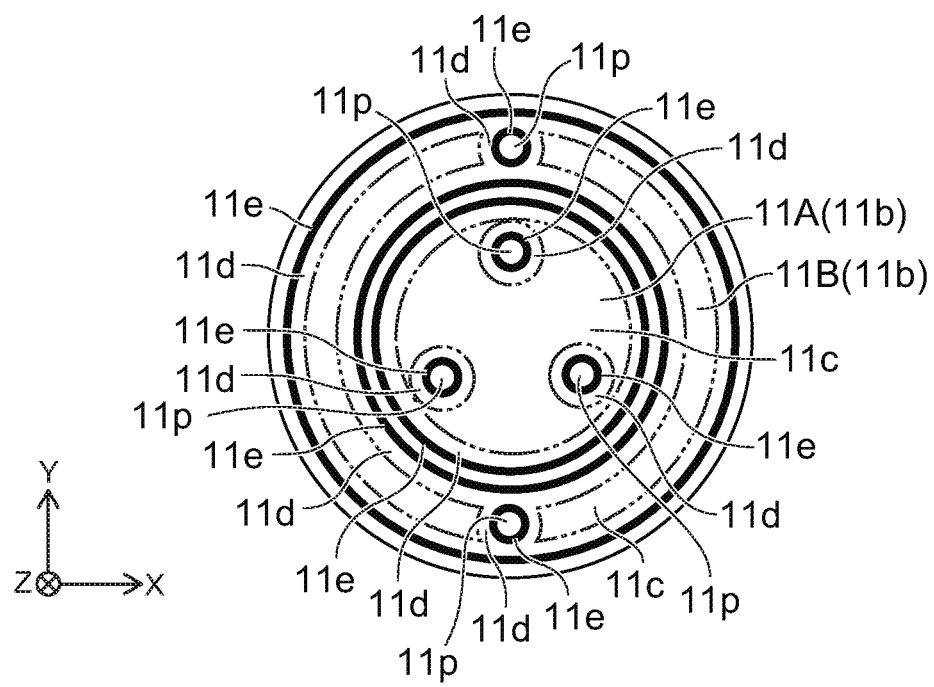
Figure 6A:
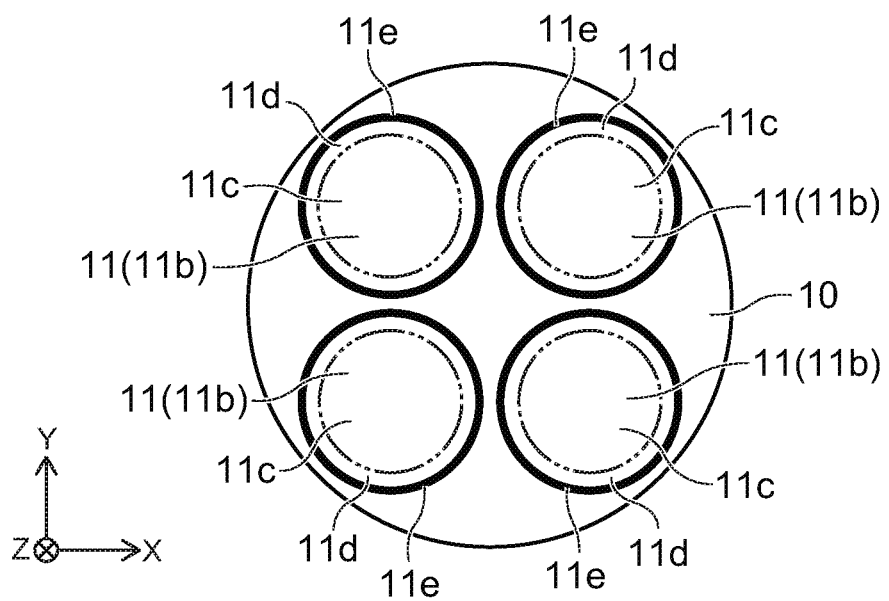
FIG. 6A and FIG. 6B are plan views schematically illustrating a portion of the electrostatic chuck according to the embodiment.
Figure 6B:
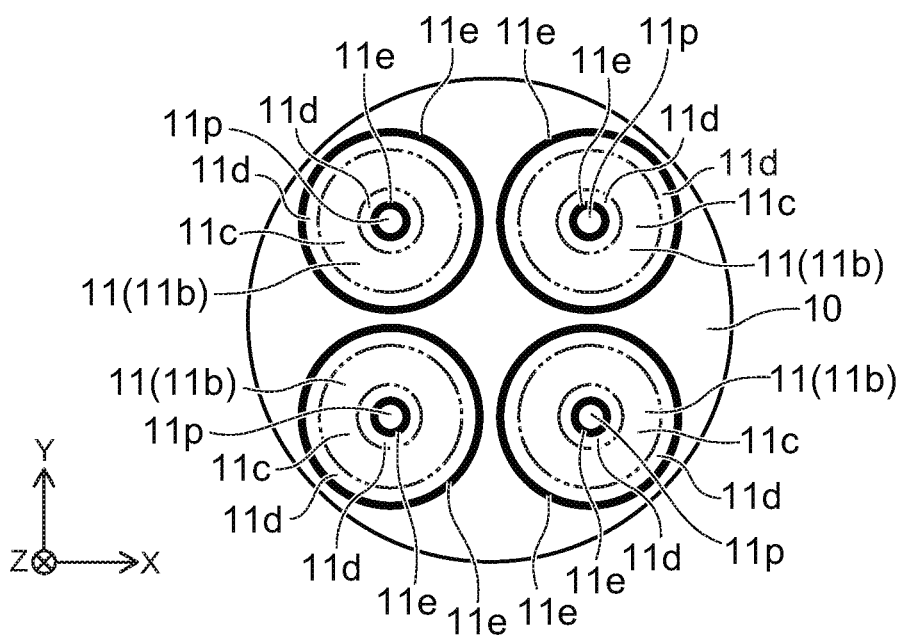

As illustrated in FIG. 4A, FIG. 4B, FIG. 5A, FIG. 5B, FIG. 6A, and FIG. 6B, at least one first electrode layer 11 that spreads along, for example, the X-Y plane is provided in the electrostatic chuck 100. The number of the first electrode layers 11 may be, for example, one as illustrated in FIG. 4A and FIG. 4B, may be two as illustrated in FIG. 5A and FIG. 5B, or may be three or more (in the example, four) as illustrated in FIG. 6A and FIG. 6B. In the case where multiple first electrode layers 11 are provided, for example, each of the first electrode layers 11 may be positioned in the same plane; or the first electrode layers 11 may be positioned in different planes in the Z-axis direction.

In the examples shown in FIG. 4A and FIG. 4B, for example, the first electrode layer 11 that is a circle when viewed along the Z-axis direction is disposed so that the center of the first electrode layer 11 and the center of the ceramic dielectric substrate 10 overlap. For example, the edge 11e of the first electrode layer 11 has a circular configuration concentric with the edge of the ceramic dielectric substrate 10. In the example, the end portion 11d of the first electrode layer 11 is disposed in a ring configuration at the ceramic dielectric substrate 10 outer perimeter side.

In the examples shown in FIG. 5A and FIG. 5B, for example, a first electrode layer 11A on the inside and a first electrode layer 11B on the outside are provided in concentric circular configurations. The first electrode layer 11A on the inside is, for example, a circle when viewed along the Z-axis direction. The first electrode layer 11B on the outside is, for example, a circular ring surrounding the first electrode layer 11A on the inside when viewed along the Z-axis direction. For example, the first electrode layer 11A on the inside and the first electrode layer 11B on the outside are arranged in concentric circular configurations so that the center of the first electrode layer 11A on the inside and the center of the ceramic dielectric substrate 10 overlap. In the example, the end portions 11d of the first electrode layer 11B on the outside are arranged in ring configurations respectively at the ceramic dielectric substrate 10 center side and at the ceramic dielectric substrate 10 outer perimeter side. The end portion 11d of the first electrode layer 11A on the inside is disposed in a ring configuration at the ceramic dielectric substrate outer perimeter side. The number of the first electrode layers 11 is not limited to two; and three or more first electrode layers 11 may be arranged in concentric circular configurations.

In the examples shown in FIG. 6A and FIG. 6B, for example, the multiple first electrode layers 11 that are circles when viewed along the Z-axis direction are arranged at point-symmetric positions with respect to the center of the ceramic dielectric substrate 10. One of the first electrode layers 11 may be disposed so that the center of the first electrode layer 11 and the center of the ceramic dielectric substrate 10 overlap. In other words, one of the first electrode layers 11 may be disposed at the center of the ceramic dielectric substrate 10. In the example, the end portion 11d of each first electrode layer 11 is disposed in a ring configuration at each first electrode layer 11 outer perimeter side.

As illustrated in FIG. 4B, FIG. 5B, and FIG. 6B, a hole 11p that pierces the first electrode layer 11 in the Z-axis direction also may be provided in the first electrode layer 11. In the case where the hole 11p is provided, the end portion 11d is disposed also at the outer perimeter vicinity of the hole 11p.

In the embodiment, the relationship between the distance D2d between the first surface 11a and the second surface 11b at the end portion 11d and the distance D2c between the first surface 11a and the second surface 11b at the central portion 11c may satisfy D2d<D2c at each location of the end portions 11d. On the other hand, the inclusion of a location where D2d<D2c is not satisfied is not excluded from the invention as long as the effects of the invention are realized. In other words, in the embodiment, it is favorable for at least a portion of the end portions 11d such as those recited above to satisfy D2d<D2c. For example, the RF responsiveness can be increased further by increasing the locations where the end portion 11d satisfies D2d<D2c.

As described above, the central portion 11c of the first electrode layer 11 is a region positioned between two end portions 11d in the X-Y plane. For example, in the first electrode layer 11, all of the regions other than the end portion 11d may be considered to be the central portion 11c. In other words, in the first electrode layer 11, for example, the vicinity of the edge 11e can be considered to be the end portion 11d; and the other regions can be considered to be the central portion 11c.

A method for making the ceramic dielectric substrate 10 inside which the first electrode layer 11 is provided will now be described.

For example, the ceramic dielectric substrate 10 inside which the first electrode layer 11 is provided can be made by stacking each layer in a state in which the first major surface 10a side is down and by sintering the stacked body. More specifically, for example, the first electrode layer 11 is stacked on a first layer which is a ceramic layer including the first major surface 10a. A second layer which is a ceramic layer including the second major surface 10b is stacked on the first electrode layer 11. Then, the stacked body is sintered.

For example, the first electrode layer 11 is formed by screen printing, paste coating (spin coating, a coater, inkjet, a dispenser, etc.), vapor deposition, etc. The first electrode layer 11 can be formed by stacking the layers over multiple times in a state in which the first major surface 10a is down. At this time, for example, the porosity of the first region 111 can be set to be lower than the porosity of the third region 113, and the porosity of the second region 112 can be set to be lower than the porosity of the third region 113 by adjusting the porosities of the first to third regions 111 to 113 by adjusting the stacking conditions, etc.

FIG. 7 is a cross-sectional view schematically illustrating a wafer processing apparatus including the electrostatic chuck according to the embodiment.

As illustrated in FIG. 7, the wafer processing apparatus 500 includes the processing container 501, the high frequency power supply 504, the chucking power supply 505, the upper electrode 510, and the electrostatic chuck 100. A processing gas inlet 502 for introducing a processing gas to the interior and the upper electrode 510 are provided at the ceiling of the processing container 501. An exhaust port 503 for evacuating the interior is provided at the bottom plate of the processing container 501. The electrostatic chuck 100 is disposed under the upper electrode 510 inside the processing container 501. The upper electrode 510 and the first electrode layer 11 of the electrostatic chuck 100 are connected to the high frequency power supply 504. In the example, the first electrode layer 11 of the electrostatic chuck 100 also is connected to the chucking power supply 505.

The first electrode layer 11 and the upper electrode 510 are provided to be substantially parallel and separated from each other by a prescribed spacing. More specifically, the first surface 11a of the first electrode layer 11 is substantially parallel to a lower surface 510a of the upper electrode 510. Also, the first major surface 10a of the ceramic dielectric substrate 10 is substantially parallel to the lower surface 510a of the upper electrode 510. The object W is placed on the first major surface 10a positioned between the first electrode layer 11 and the upper electrode 510.

When a voltage (a high frequency voltage) is applied to the first electrode layer 11 and the upper electrode 510 from the high frequency power supply 504, high frequency electric discharge occurs; the processing gas that is introduced to the processing container 501 is excited by the plasma and activated; and the object W is processed.

The object W is held to the electrostatic chuck 100 by an electrostatic force by generating a charge at the first major surface 10a side of the first electrode layer 11 when a voltage (a chucking voltage) is applied to the first electrode layer 11 from the chucking power supply 505.

Figure 8:
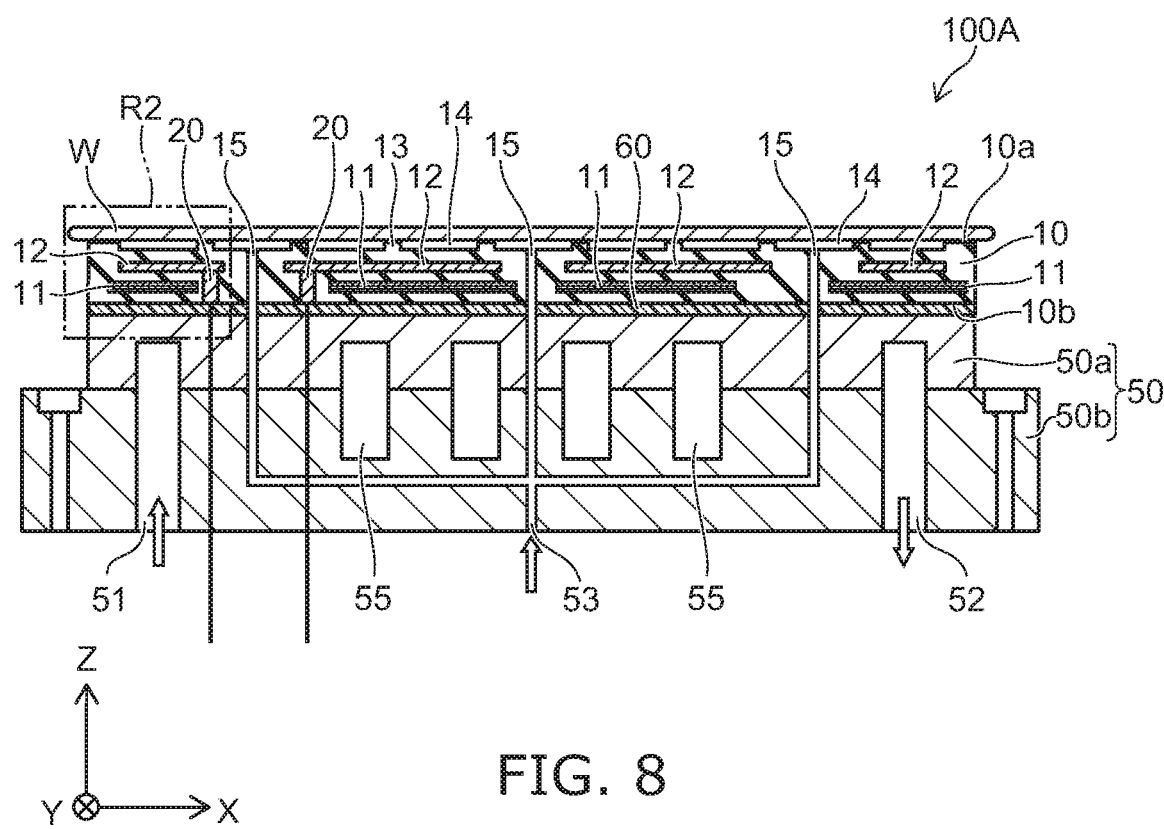
FIG. 8 is a cross-sectional view schematically illustrating another electrostatic chuck according to the embodiment.

FIG. 8 is a cross-sectional view schematically illustrating another electrostatic chuck according to the embodiment.

Figure 9:
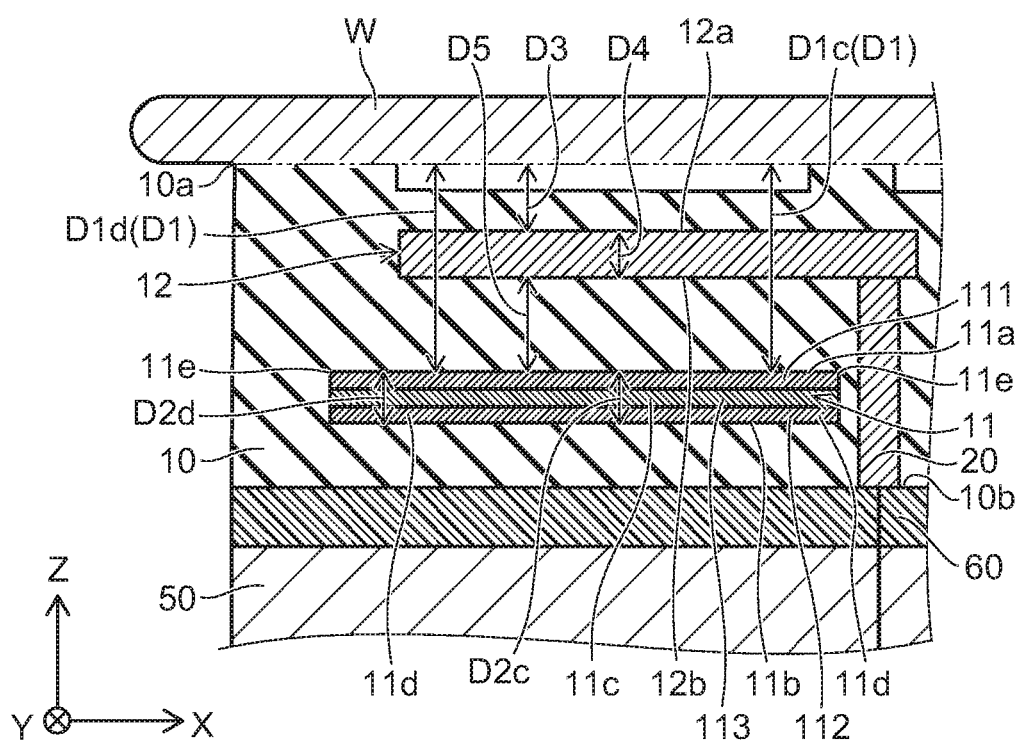
FIG. 9 is a cross-sectional view schematically illustrating an enlarged portion of the other electrostatic chuck according to the embodiment.

FIG. 9 is a cross-sectional view schematically illustrating an enlarged portion of the other electrostatic chuck according to the embodiment.

FIG. 9 shows an enlargement of a region R2 shown in FIG. 8.

In the electrostatic chuck 100A as illustrated in FIG. 8 and FIG. 9, a second electrode layer 12 is provided in addition to the first electrode layer 11 inside the ceramic dielectric substrate 10. The second electrode layer 12 is positioned between the first major surface 10a and the first electrode layer 11 in the Z-axis direction. In other words, the first electrode layer 11 is positioned between the second electrode layer 12 and the second major surface 10b in the Z-axis direction. For example, the second electrode layer 12 is sintered as one body with the ceramic dielectric substrate 10.

The second electrode layer 12 has a thin-film configuration along the first major surface 10a and the second major surface 10b of the ceramic dielectric substrate 10. The second electrode layer 12 is, for example, made of a metal. The second electrode layer 12 includes, for example, at least one of Ag, Pd, Pt, Mo, or W. The second electrode layer 12 may include, for example, a metal and a ceramic.

In the case where the first electrode layer 11 includes a metal and a ceramic and the second electrode layer 12 includes a metal and a ceramic, it is favorable for the proportion of the volume of the metal to the total of the volume of the metal and the volume of the ceramic for the metal and the ceramic included in the first electrode layer 11 to be larger than the proportion of the volume of the metal to the total of the volume of the metal and the volume of the ceramic for the metal and the ceramic included in the second electrode layer 12.

Thus, by setting the proportion of the metal included in the first electrode layer 11 to be larger than the proportion of the metal included in the second electrode layer 12, for example, the electrical resistance of the first electrode layer 11 to which the voltage is applied from the high frequency power supply can be reduced; and the RF responsiveness and the in-plane uniformity of the plasma density can be increased.

In the embodiment, the proportion of the volume of the metal to the total of the volume of the metal and the volume of the ceramic can be determined by observing the cross section of the first electrode layer 11 and the second electrode layer 12 by SEM-EDX (Energy Dispersive X-ray Spectroscopy) and by performing image analysis. More specifically, the proportion of the volume of the metal to the total of the volume of the metal and the volume of the ceramic can be calculated by acquiring a cross section SEM-EDX image of the first electrode layer 11 and the second electrode layer 12, classifying the image into ceramic and metal by EDX component analysis, and by performing image analysis to determine the surface area ratio of the ceramic and the metal.

In the case where the first electrode layer 11 includes a metal and a ceramic and the second electrode layer 12 includes a metal and a ceramic, it is also favorable for the volume of the metal included in the first electrode layer 11 to be larger than the volume of the metal included in the second electrode layer 12.

Thus, by setting the volume of the metal included in the first electrode layer 11 to be larger than the volume of the metal included in the second electrode layer 12, for example, the electrical resistance of the first electrode layer 11 to which the voltage is applied from the high frequency power supply can be reduced; and the RF responsiveness and the in-plane uniformity of the plasma density can be increased.

Figure 11:
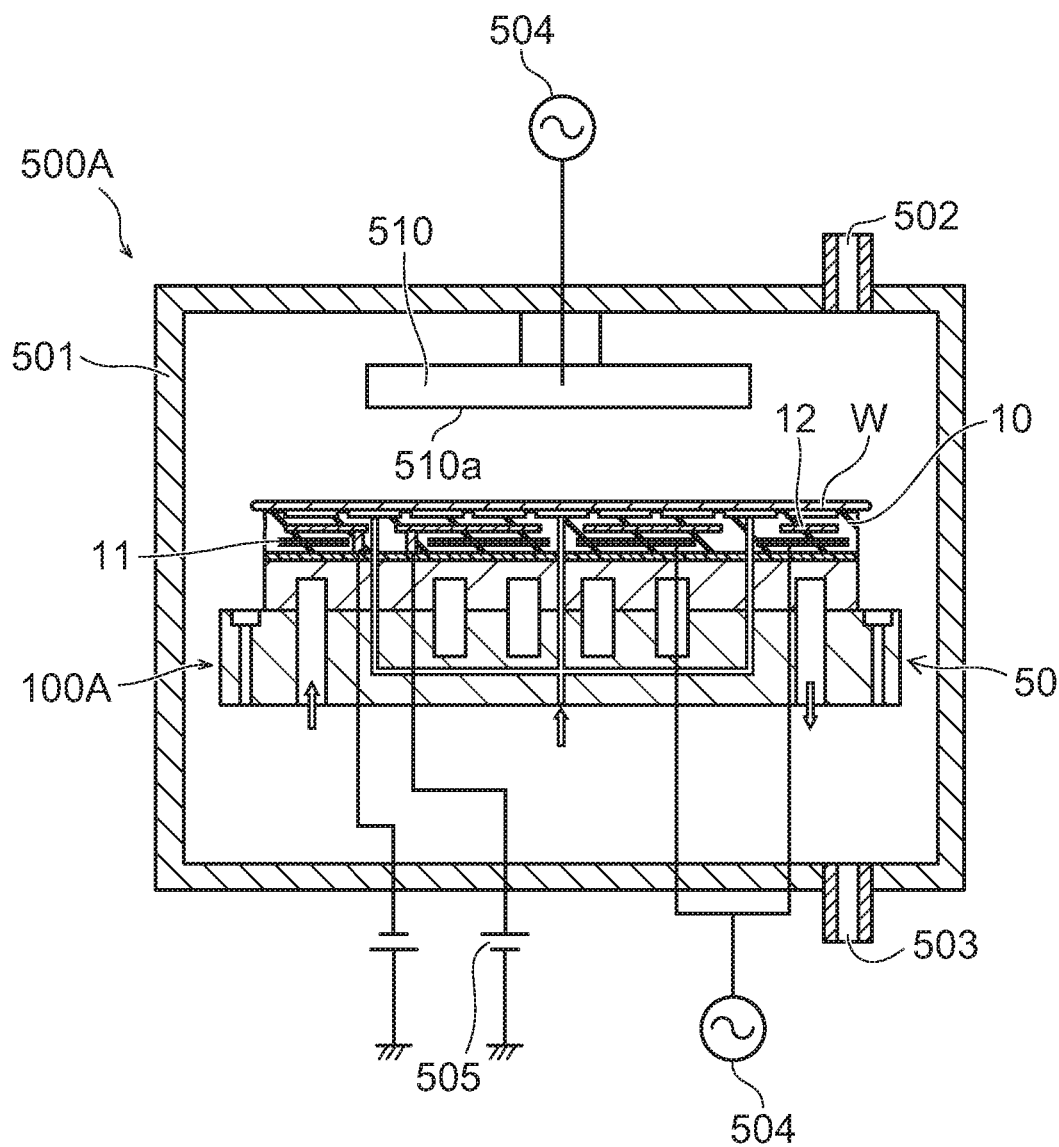
FIG. 11 is a cross-sectional view schematically illustrating a wafer processing apparatus including the other electrostatic chuck according to the embodiment.
Figure 12A:
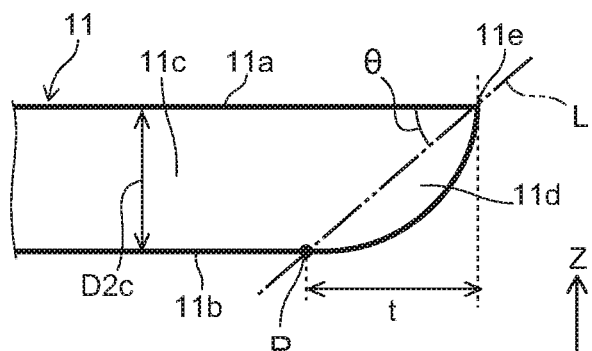
FIG. 12A to FIG. 12D are cross-sectional views schematically illustrating enlarged end portions of the first electrode layer according to the embodiment.
Figure 12B:
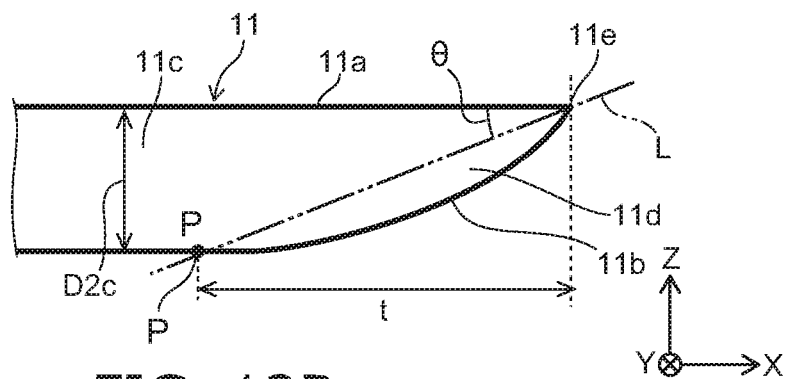
Figure 12C:
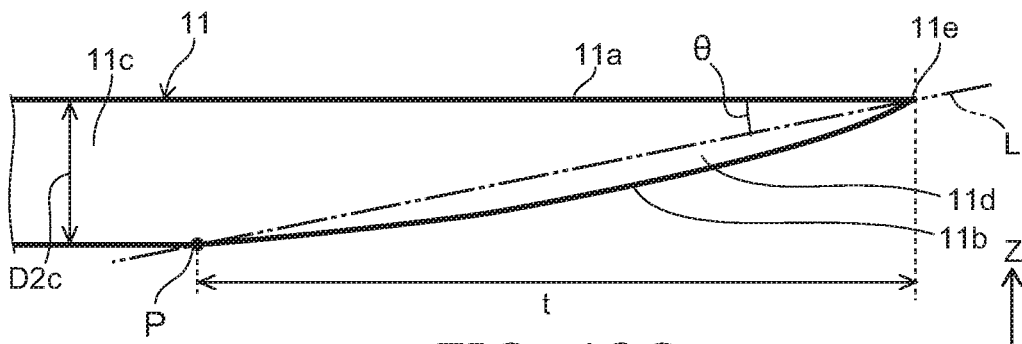
Figure 12D:
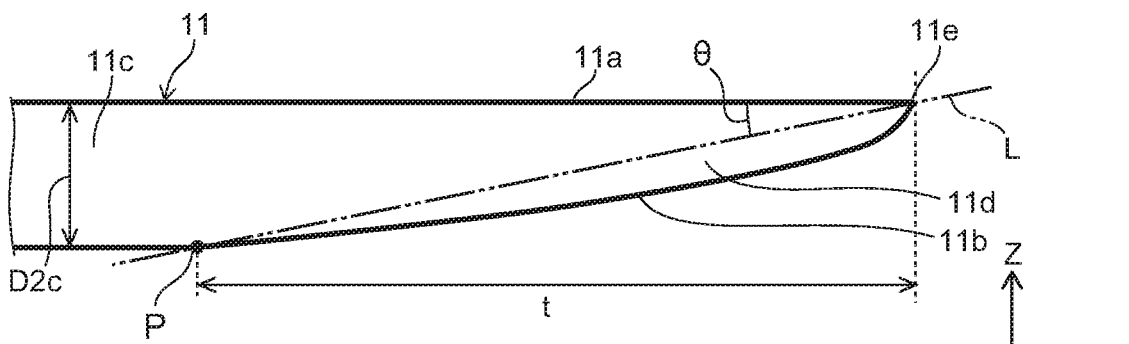

The second electrode layer 12 is connected to the chucking power supply (the chucking power supply 505 of FIG. 11). The electrostatic chuck 100A attracts and holds the object W by an electrostatic force by generating a charge at the first major surface 10a side of the second electrode layer 12 by applying a voltage (a chucking voltage) to the second electrode layer 12 from the chucking power supply. In other words, the second electrode layer 12 is a chucking electrode for attracting and holding the object W. The chucking power supply supplies a direct current (DC) or an AC current to the second electrode layer 12. Thus, according to the embodiment, the second electrode layer 12 which is the chucking electrode for attracting and holding the object can be provided separately from the first electrode layer 11 which is the lower electrode for generating the plasma.

In the example, the connection portion 20 that extends to the second major surface 10b side of the ceramic dielectric substrate 10 is provided at the second electrode layer 12. The connection portion 20 is, for example, a via (solid) or a via hole (hollow) that is electrically connected to the second electrode layer 12. The connection portion 20 may be a metal terminal connected by an appropriate method such as brazing, etc.

As illustrated in FIG. 9, the second electrode layer 12 has a third surface 12a on the first major surface 10a side, and a fourth surface 12b on the side opposite to the third surface 12a. In other words, the fourth surface 12b is the surface opposing the first electrode layer 11. In other words, the fourth surface 12b is the surface opposing the first surface 11a of the first electrode layer 11.

The third surface 12a may be a surface parallel to the first major surface 10a. For example, a distance D3 along the Z-axis direction between the third surface 12a and the first major surface 10a is constant. In other words, the distance D3 is the distance from the first major surface 10a to the upper surface (the third surface 12a) of the second electrode layer 12.

It is also favorable for the fourth surface 12b to be a surface parallel to the third surface 12a. It is also favorable for the fourth surface 12b to be a surface parallel to the first major surface 10a. More specifically, it is also favorable for a distance D4 along the Z-axis direction between the fourth surface 12b and the third surface 12a to be constant. In other words, the distance D4 is the thickness of the second electrode layer 12. For example, the thickness of the second electrode layer 12 can be determined as the average value of the thicknesses at three points in a cross section SEM image of the second electrode layer 12.

For example, the thickness of the first electrode layer 11 is greater than the thickness of the second electrode layer 12. By setting the thickness of the first electrode layer 11 to be greater than the thickness of the second electrode layer 12, the effects of the skin effect can be reduced; and the in-plane uniformity of the plasma density can be increased further.

A distance D5 along the Z-axis direction between the first electrode layer 11 and the second electrode layer 12 (i.e., the distance along the Z-axis direction between the first surface 11a and the fourth surface 12b) is, for example, greater than a distance D3 along the Z-axis direction between the first major surface 10a and the second electrode layer 12 (i.e., the distance along the Z-axis direction between the third surface 12a and the first major surface 10a).

Thus, by setting the distance D5 to be longer than the distance D3, the occurrence of discrepancies such as shorts and/or dielectric breakdown between the first electrode layer 11 and the second electrode layer 12, etc., can be suppressed more effectively even when the voltage is applied from the high frequency power supply.

Figure 10A:
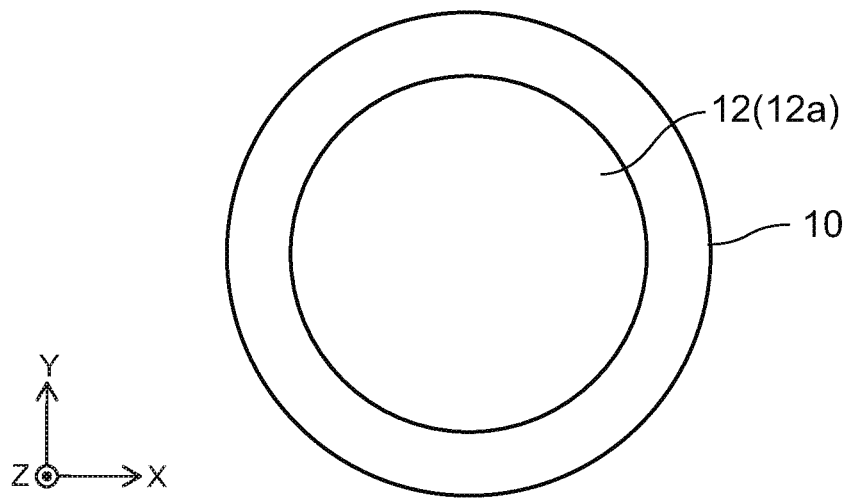
FIG. 10A and FIG. 10B are plan views schematically illustrating a portion of the other electrostatic chuck according to the embodiment.
Figure 10B:
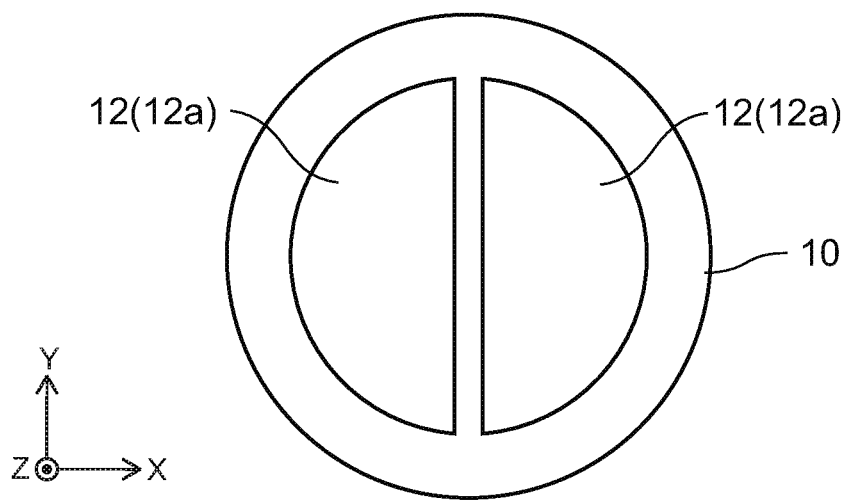

FIG. 10A and FIG. 10B are plan views schematically illustrating a portion of the other electrostatic chuck according to the embodiment.

These drawings are plan views viewing the second electrode layer 12 from the third surface 12a side (the upper side) in a state in which the portion of the ceramic dielectric substrate 10 positioned at the first major surface 10a side (the upper side) of the second electrode layer 12 (the third surface 12a) of the electrostatic chuck 100A is not illustrated.

As illustrated in FIG. 10A and FIG. 10B, the second electrode layer 12 may be unipolar or bipolar. In the case where the second electrode layer 12 is unipolar, one second electrode layer 12 that spreads along the X-Y plane is provided as illustrated in FIG. 10A. The second electrode layer 12 is, for example, substantially circular when viewed along the Z-axis direction. On the other hand, in the case where the second electrode layer 12 is bipolar, two second electrode layers 12 that spread along the X-Y plane and are positioned in the same plane are provided as illustrated in FIG. 10B. The second electrode layers 12 each are, for example, substantially semicircular when viewed along the Z-axis direction. For example, the second electrode layer 12 may have a pattern spreading along the X-Y plane.

For example, a portion of the first electrode layer 11 does not overlap the second electrode layer 12 in the Z-axis direction. The total of the surface area of the first surface 11a (the surface on the first major surface 10a side) of the first electrode layer 11 is, for example, larger than the total of the surface area of the third surface 12a (the surface on the first major surface 10a side) of the second electrode layer 12. In other words, when viewed along the Z-axis direction, the total of the surface area of the first electrode layer 11 is larger than the total of the surface area of the second electrode layer 12. The in-plane uniformity of the plasma density can be increased further thereby.

FIG. 11 is a cross-sectional view schematically illustrating a wafer processing apparatus including the other electrostatic chuck according to the embodiment.

As illustrated in FIG. 11, other than the electrostatic chuck 100 being modified to be the electrostatic chuck 100A illustrated in FIG. 8, the wafer processing apparatus 500A is substantially the same as the wafer processing apparatus 500 illustrated in FIG. 7.

In the wafer processing apparatus 500A, the chucking power supply 505 is connected to the second electrode layer 12 of the electrostatic chuck 100A but not to the first electrode layer 11 of the electrostatic chuck 100A. The object W is held to the electrostatic chuck 100A by an electrostatic force by generating a charge at the first major surface 10a side of the second electrode layer 12 when the voltage (the chucking voltage) is applied to the second electrode layer 12 from the chucking power supply 505.

FIG. 12A to FIG. 12D are cross-sectional views schematically illustrating enlarged end portions of the first electrode layer according to the embodiment.

As illustrated in FIG. 12A to FIG. 12D, a width t which is the length in the X-axis direction of the end portion 11d of the first electrode layer 11 is, for example, greater than a thickness D2c at the central portion 11c of the first electrode layer 11 when viewed in cross-section (thickness D2c<width t). In other words, the width t of the end portion 11d is the width of the oblique surface of the second surface 11b. That is, the width t is the length in the X-axis direction between the edge 11e and a lower end P of the oblique surface of the second surface 11b (where the obliqueness ends). Thus, the power supply distance can be shortened by setting the width t of the end portion 11d to be greater than the thickness D2c at the central portion 11c of the first electrode layer 11. Thereby, the responsiveness (the RF responsiveness) to the control such as modifying the RF output, etc., can be increased further.

The lower end P of the oblique surface can be determined from the cross-sectional image of a sample cut to include the first electrode layer 11. In the embodiment, for example, at least one location of the sample satisfies the relationship recited above (thickness D2c<width t). In the embodiment, it is more favorable for multiple locations of the sample to satisfy the relationship recited above (thickness D2c<width t).

An angle θ of the oblique surface of the second surface 11b is, for example, not less than 10 degrees and not more than 80 degrees, and favorably not less than 20 degrees and not more than 60 degrees. The angle θ can be expressed as the angle (the minor angle) between the first surface 11a and a line L, wherein the line L is a straight line connecting the edge 11e and the lower end P of the oblique surface of the second surface 11b (where the obliqueness ends). The power supply distance can be shortened by reducing the angle θ. Thereby, the responsiveness (the RF responsiveness) to the control such as modifying the RF output, etc., can be increased further.

Although a curved cross-sectional configuration between the lower end P and the edge 11e is shown in these drawings, the cross-sectional configuration between the lower end P and the edge 11e is not limited thereto and may be a linear cross-sectional configuration. By using a linear configuration, for example, the power supply distance can be shorter.

As described above, according to the embodiments, an electrostatic chuck can be provided to improve the heat dissipation from the lower electrode for plasma generation built into the dielectric layer.

Hereinabove, embodiments of the invention are described. However, the invention is not limited to these descriptions. Appropriate design modifications made by one skilled in the art for the embodiments described above also are within the scope of the invention to the extent that the features of the invention are included. For example, the configurations, the dimensions, the materials, the arrangements, the mounting methods, etc., of the components included in the electrostatic chuck are not limited to those illustrated and can be modified appropriately.

Also, the components included in the embodiments described above can be combined within the limits of technical feasibility; and such combinations are within the scope of the invention to the extent that the features of the invention are included.

What is claimed is:

1. An electrostatic chuck, comprising:
    a ceramic dielectric substrate having a first major surface and a second major surface, an object to be chucked being placed on the first major surface, the second major surface being on a side opposite to the first major surface;
    a base plate supporting the ceramic dielectric substrate; and
    at least one first electrode layer provided inside the ceramic dielectric substrate and connected to a high frequency power supply,
    the first electrode layer being provided between the first major surface and the second major surface in a Z-axis direction, the Z-axis direction being from the base plate toward the ceramic dielectric substrate,
    the first electrode layer having a first surface and a second surface, the first surface being on the first major surface side, the second surface being on a side opposite to the first surface,
    the first electrode layer including a first region, a second region, and a third region, the first region including the first surface, the second region including the second surface, the third region being positioned between the first region and the second region in the Z-axis direction,
    a porosity of the first region being lower than a porosity of the third region.

2. The chuck according to claim 1, wherein a porosity of the second region is lower than the porosity of the third region.

3. The chuck according to claim 1, wherein the porosity of the third region is not less than 2% and not more than 40%.

4. The chuck according to claim 1, wherein at least one of the porosity of the first region or a porosity of the second region is less than 2%.

5. The chuck according to claim 1, wherein
    the first electrode layer is supplied with power from the second surface side,
    a distance along the Z-axis direction between the first surface and the first major surface is constant, and
    a distance along the Z-axis direction between the second surface and the first surface at an end portion of the first electrode layer is shorter than a distance along the Z-axis direction between the second surface and the first surface at a central portion of the first electrode layer.

6. The chuck according to claim 1, wherein the first electrode layer includes at least one of Ag, Pd, or Pt.

7. The chuck according to claim 1, wherein the first electrode layer is made of a cermet of a metal and a ceramic.

8. The chuck according to claim 1, wherein a distance along the Z-axis direction between the second surface and the first surface at a central portion of the first electrode layer is not less than 1 μm and not more than 500 μm.

9. The chuck according to claim 8, wherein the distance along the Z-axis direction between the second surface and the first surface at the central portion of the first electrode layer is not less than 10 μm and not more than 100 μm.

10. The chuck according to claim 1, wherein
    the ceramic dielectric substrate includes aluminum oxide, and
    a concentration of the aluminum oxide in the ceramic dielectric substrate is 90 mass % or more.

11. The chuck according to claim 1, further comprising at least one second electrode layer provided inside the ceramic dielectric substrate and connected to a chucking power supply,
    the second electrode layer being provided between the first electrode layer and the first major surface in the Z-axis direction.

12. The chuck according to claim 11, wherein a total of a surface area of the first surface of the first electrode layer is larger than a total of a surface area of a surface of the second electrode layer on the first major surface side.

13. The chuck according to claim 11, wherein a thickness of the first electrode layer is greater than a thickness of the second electrode layer.

14. The chuck according to claim 11, wherein a portion of the first electrode layer does not overlap the second electrode layer in the Z-axis direction.

15. The chuck according to claim 11, wherein
the first electrode layer includes a metal and a ceramic,
the second electrode layer includes a metal and a ceramic, and
a proportion of a volume of the metal to a total of the volume of the metal and a volume of the ceramic for the metal and the ceramic included in the first electrode layer is larger than a proportion of a volume of the metal to a total of the volume of the metal and a volume of the ceramic for the metal and the ceramic included in the second electrode layer.

16. The chuck according to claim 11, wherein
the first electrode layer includes a metal and a ceramic,
the second electrode layer includes a metal and a ceramic, and
a volume of the metal included in the first electrode layer is larger than a volume of the metal included in the second electrode layer.

17. The chuck according to claim 11, wherein a distance along the Z-axis direction between the first electrode layer and the second electrode layer is greater than a distance along the Z-axis direction between the first major surface and the second electrode layer.

18. The chuck according to claim 1, wherein the first electrode layer is connected to a chucking power supply.

19. The chuck according to claim 5, wherein a width of the end portion is greater than the distance along the Z-axis direction between the second surface and the first surface at the central portion of the first electrode layer.

* * * * *